United States Patent
Porcher et al.

[11] Patent Number: 5,877,639
[45] Date of Patent: Mar. 2, 1999

[54] DURATION AND FREQUENCY PROGRAMMABLE ELECTRONIC PULSE GENERATOR

[75] Inventors: Michel Porcher, La Chapelle sur Erdre; Stephane Chesnais, Petit-Mars; Jean Desuché, Carquefou, all of France

[73] Assignee: MHS, Nantes, France

[21] Appl. No.: 887,607

[22] Filed: Jul. 3, 1997

[30] Foreign Application Priority Data

Jul. 5, 1996 [FR] France .................................. 96 08417

[51] Int. Cl.⁶ .................................................. H03B 19/00
[52] U.S. Cl. .......................... 327/114; 327/175; 327/176; 711/108
[58] Field of Search ..................... 327/113, 114, 327/172, 175, 176; 326/105; 711/108; 365/230.06, 231

[56] References Cited

U.S. PATENT DOCUMENTS

| 4,255,790 | 3/1981 | Hondeghem | 364/487 |
| 5,226,009 | 7/1993 | Arimoto | 365/189.04 |
| 5,383,146 | 1/1995 | Threewitt | 365/49 |

FOREIGN PATENT DOCUMENTS

| 2596600 | 10/1987 | France . |
| 40 37 942 A | 5/1992 | Germany . |
| 2076517 | 12/1981 | United Kingdom . |

OTHER PUBLICATIONS

*Elektor Electronics*; Author: A. Rigby; Title: *Test Pattern Generator*; First page under heading Patterns for Testing.

*Primary Examiner*—Timothy P. Callahan
*Assistant Examiner*—Minh Nguyen
*Attorney, Agent, or Firm*—Larson & Taylor

[57] ABSTRACT

A duration and frequency programmable electronic integrated pulse generator comprises an initialization circuit driven by a reference clock signal and an initialization/comparison signal and producing m initialization values, and a periodic count value coded on n bits. An address decoder module produces write-control bits, while a bits comparison matrix including n×m comparison cells each including a RAM and CAM memory cell write-addressable by the write-control bits. Each CAM cell stores a bit $CAM_{ij}$ of an initialization value and produces a complemented value $\overline{CAM_{ij} \oplus BL_i}$, each RAM memory cell of address i, j produces a masking value $M_{ij}$, and each comparison cell produces a value $HIT_{ij} = \overline{(CAM_{ij} \oplus BL_i)} + M_{ij}$. All the cells of the same line of rank j are coupled by an OR function and produce, each output $S_j$, a programmed pulse represented by the equation:

$$HIT_j = \sum_{i=0}^{n-1} HIT_{ij} = \sum_{i=0}^{n-1} [\overline{(CAM_{ij} \oplus BL_i)} + M_{ij}]$$

according to a harmonic periodic signal of the periodic count value.

7 Claims, 8 Drawing Sheets

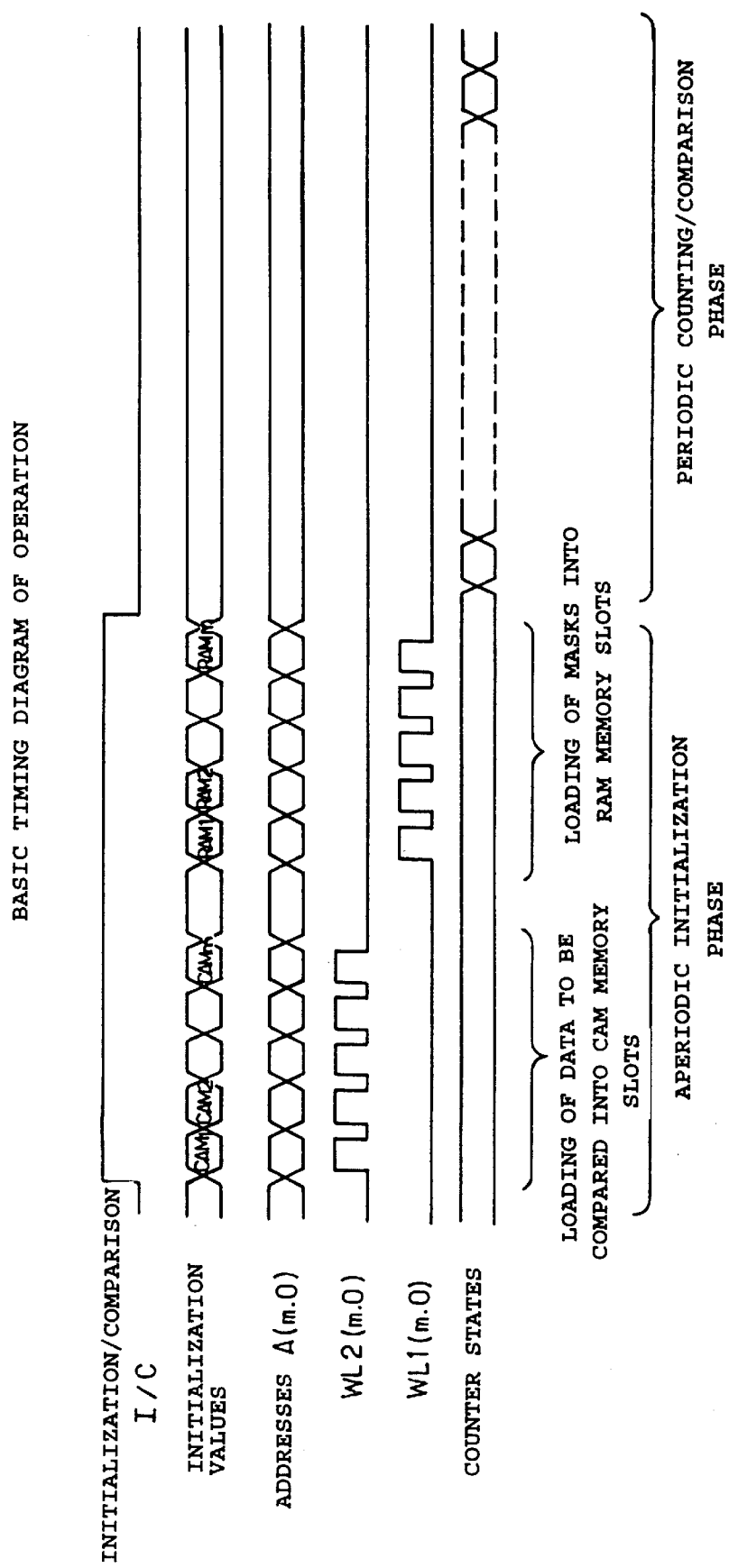

$$HIT_{ij} = \overline{(CAM_{ij} \oplus BL_i) + M_{ij}}$$

FIG.2e. EXAMPLE OF PWM OUTPUT WITH $2^5$ COUNTER AND VALUE PRELOADED TO 10010

STATES OF THE COUNTER/TIMEBASE

| $2^4$ | $2^3$ | $2^2$ | $2^1$ | $2^0$ |
|---|---|---|---|---|
| 0 | 0 | 0 | 0 | 0 |
| 0 | 0 | 0 | 0 | 1 |
| 0 | 0 | 0 | 1 | 0 |
| 0 | 0 | 0 | 1 | 1 |
| 0 | 0 | 1 | 0 | 0 |
| 0 | 0 | 1 | 0 | 1 |
| 0 | 0 | 1 | 1 | 0 |
| 0 | 0 | 1 | 1 | 1 |
| 0 | 1 | 0 | 0 | 0 |
| 0 | 1 | 0 | 0 | 1 |
| 0 | 1 | 0 | 1 | 0 |
| 0 | 1 | 0 | 1 | 1 |
| 0 | 1 | 1 | 0 | 0 |
| 0 | 1 | 1 | 0 | 1 |
| 0 | 1 | 1 | 1 | 0 |
| 0 | 1 | 1 | 1 | 1 |
| 1 | 0 | 0 | 0 | 0 |
| 1 | 0 | 0 | 0 | 1 |
| 1 | 0 | 0 | 1 | 0 |
| 1 | 0 | 0 | 1 | 1 |
| 1 | 0 | 1 | 0 | 0 |
| 1 | 0 | 1 | 0 | 1 |
| 1 | 0 | 1 | 1 | 0 |
| 1 | 0 | 1 | 1 | 1 |
| 1 | 1 | 0 | 0 | 0 |
| 1 | 1 | 0 | 0 | 1 |
| 1 | 1 | 0 | 1 | 0 |
| 1 | 1 | 0 | 1 | 1 |
| 1 | 1 | 1 | 0 | 0 |
| 1 | 1 | 1 | 0 | 1 |
| 1 | 1 | 1 | 1 | 0 |
| 1 | 1 | 1 | 1 | 1 |

$2^4 2^3 2^2 2^1 2^0$ CONTENT OF A CAM LINE

STRICT COMPARISON — 10010
1 — 1001X
2 — 100XX
3 — X0010
4 — 1X010
5 — 10X10
6 — 100X0
7 — 1X0X0
8 — 10XX0

DURATION AND FREQUENCY PROGRAMMABLE ELECTRONIC PULSE GENERATOR

BACKGROUND OF THE INVENTION

The invention relates to a duration and frequency programmable electronic pulse generator.

In the current industrial world, many applications require the implementation of operations for measuring absolute or relative time and for generating electronic pulses at precise instants. These operations or functions are usually carried out by up-counters, down-counters, signal generators or width-modulated electronic pulses, denoted PWM standing for Pulse Width Modulation or frequency synthesizers. All of the above devices include a clock, or a counter, as well as electronic circuits capable of producing state actions dependent on time or on extraneous events. These devices may be used in widely varying sectors of activity and make it possible to produce either electronic pulses of variable frequency or duty ratio, or, by integration, variable analog voltages.

By way of an example application, it is indicated that the field of automobile construction uses PWM to implement antilock braking systems ABS, speed display, lighting intensity dimmer modules, controls for electric motors, such as stepper motors, and frequency telecontrol.

Likewise, in the telecommunications sector, PWM devices may be used for the synchronization of real-time systems, the creation of electronic numbering pulses (DTMF) or ringer tones.

Finally, in the field of production industry, PWM devices are used for the positioning of telecontrol servomotors, the control of motors and lighting dimmers for example. Frequency synthesizers may serve in the creation of sounds, and the modulation of signals transmitted over wires or optical fiber.

Generally, the PWM devices known in the state of the art have several outputs, each of these outputs being the site of an individual switching, generating a pulse, when a timebase, such as a counter, coincides with the value assigned to the relevant output. Each output then reverts to its complemented switching state when the counter reaches its final periodic count value, denoted modulo value. Such a mode of operation considerably reduces the flexibility of these devices, especially when it is necessary, either to produce multiple pulses, pulse trains, or when phase-shifted controls have to be produced, the phase-shift having, in such a case, to be greater than the time interval between the switching into coincidence with the value assigned and the modulo value.

By way of example of devices of this type, such as represented in FIG. 1a, these comprise a timebase, which is common to all the generators or PWM outputs, and which is incremented with each edge of a system clock pulse. When the content of the counter/timebase is equal to 0, all the PWM outputs pass to a first state, whereas when the content of the counter/timebase is equal to the value assigned to a generator or PWM output, this output switches to a second state, the complement of the first state. This process is performed by way of a comparator which switches the output when the two values are equal. When the count value of the counter reaches its modulo value, all the PWM outputs are switched to the first state, and so on. A timing diagram of the corresponding signals is represented in FIG. 1b.

An improvement to the devices of the type represented in FIG. 1a consists, as represented in FIG. 1c, in using a counter/timebase whose modulo value is larger and in comparing the content of a register for storing the assignment value coded on n bits of the PWM device with the [n−2, . . . , 0] lowest-order bits of the counter and the content of another register of another PWM device with the n−1 highest-order bits. By reason of the fact that the timebase effected by the n−1 lowest-order bits is twice as fast as that effected by the n bits, the periods of the corresponding PWM outputs differ in a ratio 2. This mode of operation affords an improvement over that represented in FIGS. 1a and 1b, the speed of comparison being, at most, doubled, but nevertheless limits the desired flexibility since one of the outputs is blocked for a period T whereas the other output remains blocked for a period T/2.

Finally, certain more sophisticated devices make it possible to choose either one PWM output over T and the other output over T/2, as in the case of FIGS. 1c, 1d, or both over T, or else both over T/2.

However, these devices nevertheless remain subject to the time constraint T or T/2.

One solution could, as the case may be, consist in adopting other periods, sub-multiples of T, but the basic limitations remain.

Another solution could also consist in installing one counter/timebase per PWM output.

However, the above solutions are difficult to envisage in the case in which the number of PWM outputs is extended, in particular with a view to an embodiment in integrated circuit form, by reason of the silicon on-cost engendered by the proliferation of auxiliary circuits such as counter/timebase and multiplexer, which makes the installing of these devices almost unattainable.

The object of the present invention is to remedy the above drawbacks by implementing a PWM generator which, although using only a single counter/timebase, nevertheless makes it possible to produce electronic pulses of programmable width and frequency.

Another object of the present invention is, moreover, the implementation of such a width and frequency programmable electronic pulse PWM generator on a plurality of distinct outputs, thus making it possible to confer very great flexibility of use on such a generator.

Another object of the present invention is also the implementation of a PWM generator in which the period of a transmitted pulse train is greater than or equal to that of the reference clock, system clock signal.

Another object of the present invention is finally the implementation of a PWM generator in integrated circuit form, in CMOS technology, in which the silicon cost is minimized, in the absence of the proliferation of auxiliary circuits.

BRIEF SUMMARY OF THE INVENTION

The duration and frequency programmable electronic pulse generator, which is the subject of the present invention, comprises m distinct programmable outputs $S_j$, j $\epsilon[0,m-1]$.

It is noteworthy in that it includes at least a timebase-initialization circuit driven by a reference clock signal and by an initialization/comparison signal, the said timebase-initialization circuit delivering at least m initialization values coded on n bits for the true value of the initialization signal, each bit of the said initialization values being denoted $CAM_{ij}$, i $\epsilon[0,n-1]$, respectively a periodic count value coded on n bits, for the true value of the comparison signal, each bit of the count value being denoted $BL_i$. An address decoding module receives a plurality of address values X $\epsilon[0,m-1]$ and delivers on word lines a write-control address bit $WL_{1j}$, $WL_{2j}$. A bits comparison matrix including n×m comparison cells arranged in m rows and n columns is provided. Each comparison cell $C_{ij}$ includes a RAM memory cell and a CAM memory cell, content-addressable memory cell, the said memory cells being write-addressable on the said word lines by a write-control address bit $WL_{1j}$ and $WL_{2j}$, and each receiving for storage the bit of rank i $BL_i$ of the said count value. Each comparison cell with address i, j makes it possible, on the one hand, to store the said corresponding bit $CAM_{ij}$ of the initialization value for the true value of the initialization signal and, on the other hand, to deliver a value $\overline{CAM_{ij} \oplus BL_i}$, complemented value of the exclusive-OR product of this bit $CAM_{ij}$ of the initialization value and the bit $BL_i$ of the count value $BL_i$. Each RAM memory cell with address i, j delivers a masking bit value stored for the true value of the initialization signal, and denoted $M_{ij}$, and each CAM and RAM memory cell of like address i, j are coupled by a logic coupling of the OR type, each comparison cell $C_{ij}$ delivering a resulting value $$HIT_{ij} = \overline{(CAM_{ij} \oplus BL_i)} + M_{ij}.$$

All the comparison cells $C_{ij}$ of the same line of rank j are coupled by a logic function of OR type to the corresponding output $S_j$, this making it possible to perform a comparison between a word of n bits stored in the CAM memory cells of each line of rank j for the true value of the initialization signal and the count value delivered by the driven timebase-initialization circuit for the true value of the comparison signal and thus to produce on each output $S_j$ a programmed pulse satisfying the relation:

$$HIT_j = \sum_{i=0}^{n-1} HIT_{ij} = \sum_{i=0}^{n-1} [\overline{(CAM_{ij} \oplus BL_i)} + M_{ij}]$$

according to a periodic signal whose period is a harmonic period of the period of the periodic count value.

The programmable electronic pulse generator, which is the subject of the present invention, can be used in all the industrial fields previously mentioned in the description.

BRIEF DESCRIPTION OF THE DRAWINGS

It will be better understood on reading the description below and on looking at the drawings in which, apart from FIGS. 1a to 1d relating to the prior art.

FIG. 2b represents a timing diagram of the signals employed for carrying out the mode of operation of the electronic pulse generator, which is the subject of the present invention, according to an initialization phase followed by a comparison phase;

FIG. 2c represents, in detail, an advantageous embodiment of a bits comparison cell, consisting of a RAM memory cell and a content-addressable CAM memory cell, a set of bits comparison cells organized as a matrix allowing the implementation of the programmable electronic pulse generator represented in FIG. 2a;

FIG. 2e represents, by way of non-limiting example, a timing diagram of programmed electronic pulses obtained from a $2^5$ up/down-counter for various initialization values of a line of comparison cells, in particular of CAM memory cells;

DETAILED DESCRIPTION OF THE INVENTION

A more detailed description of a duration and frequency programmable electronic pulse generator, in accordance with the subject of the present invention, will now be given in conjunction with FIGS. 2a, 2b and 2c.

Figure 1A:
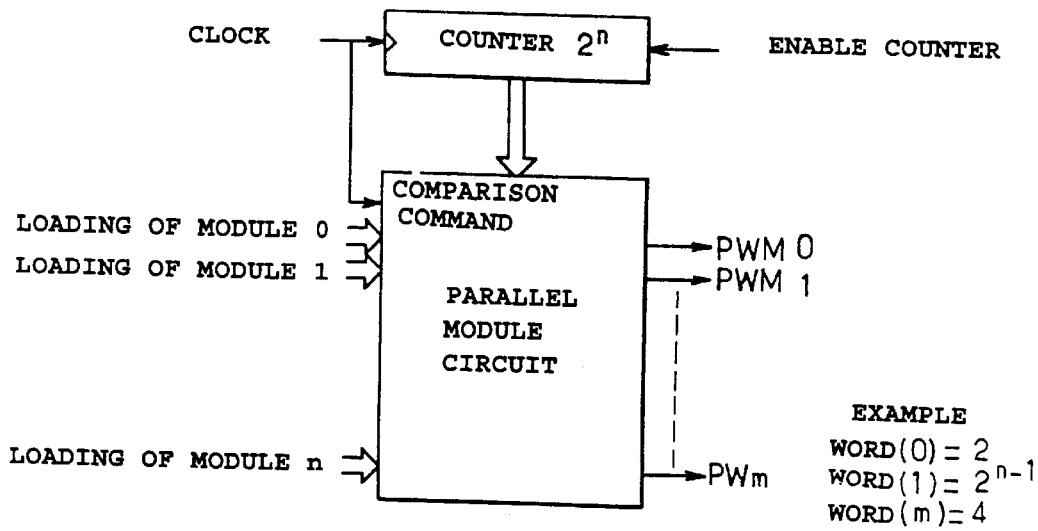
Figure 1B:
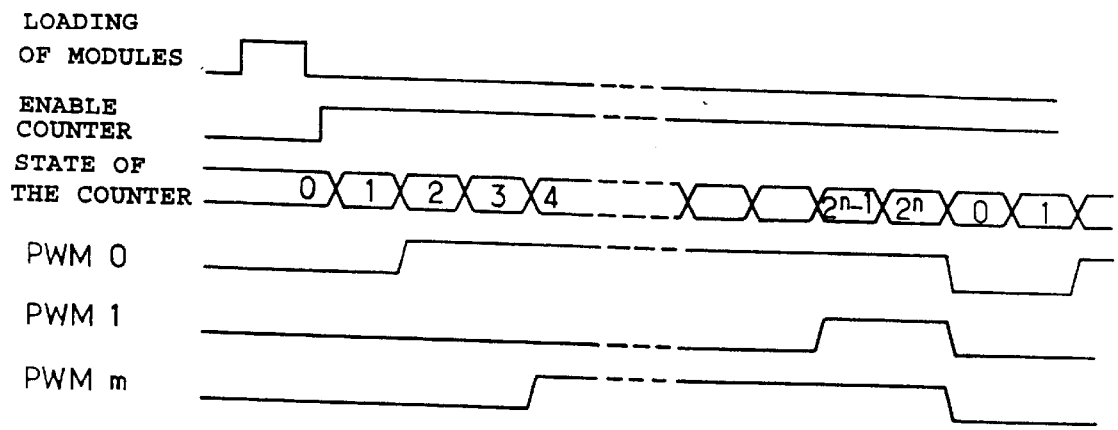
Figure 1C:
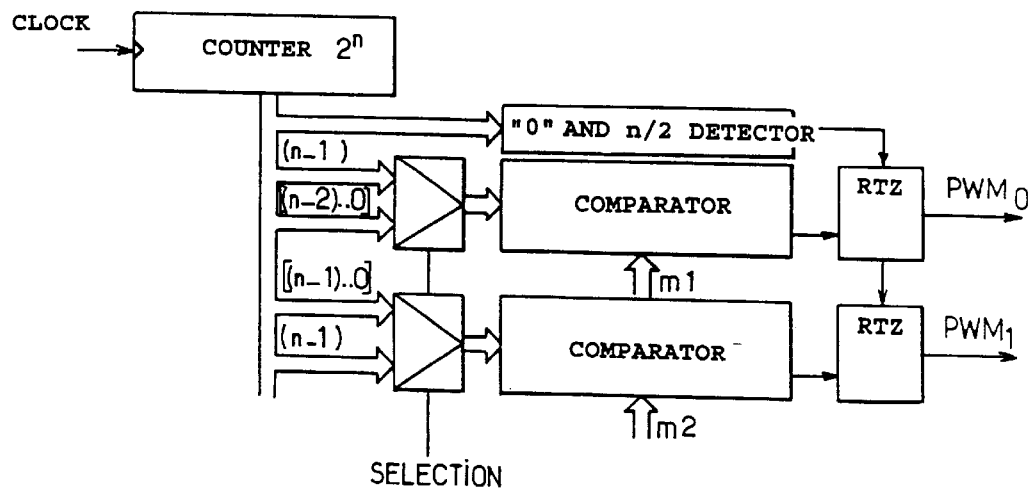
Figure 1D:
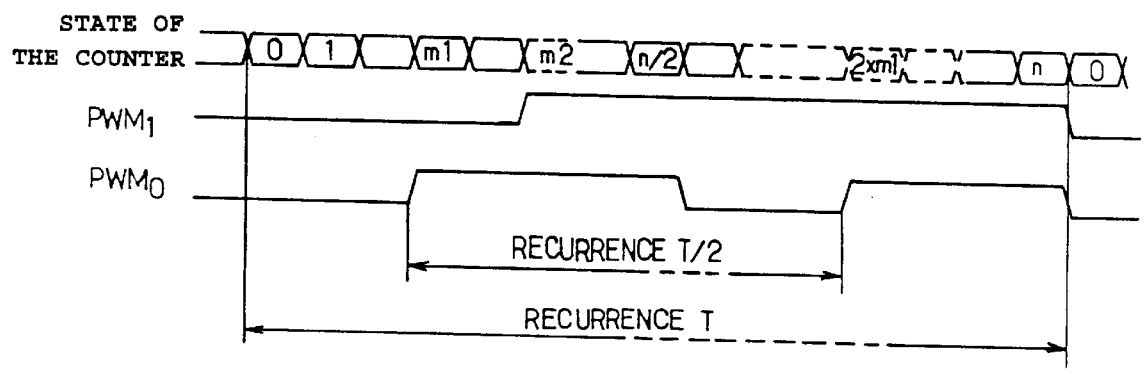
Figure 2A:
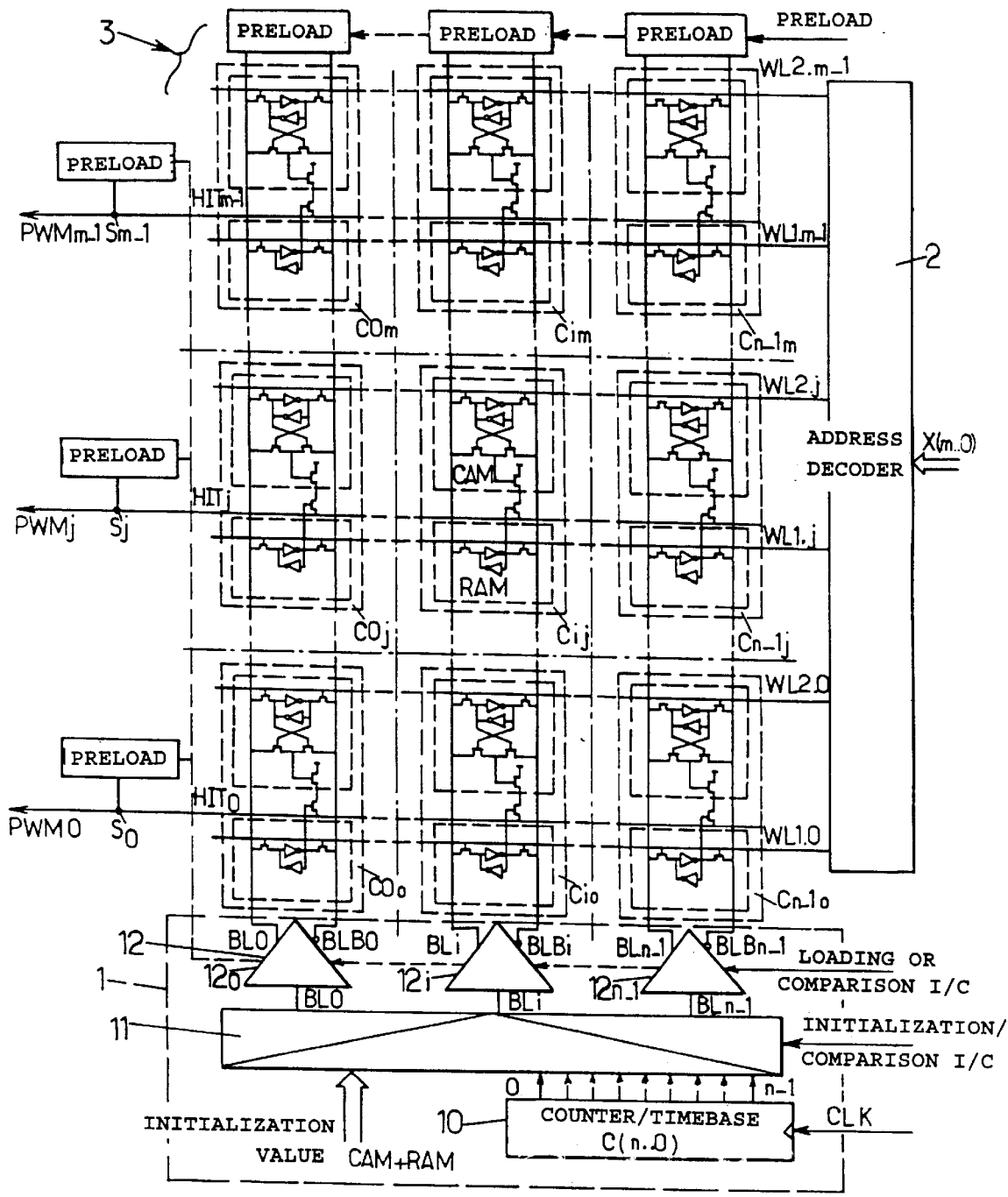
FIG. 2a represents, in the form of functional blocks, a general layout of the duration and frequency programmable electronic pulse generator, which is the subject of the resent invention.

The duration and frequency programmable electronic pulse generator, which is the subject of the present invention, such as represented in FIG. 2a, comprises m distinct programmable outputs denoted $S_j$, j $\epsilon[0,m-1]$. By distinct programmable outputs it is indicated that each output $S_j$ is able periodically to produce a waveform distinct from the waveforms produced by the other outputs. Each output $S_j$ is connected to a port delivering the aforesaid waveforms, denoted $PWM_j$.

In accordance with a particularly noteworthy aspect of the pulse generator, which is the subject of the present invention, the latter comprises, as represented in FIG. 2a, at least one timebase-initialization circuit driven by a clock signal, noted CLK, this clock signal constituting a reference clock signal delivered, for example, by the operating system of a computer unit.

The timebase-initialization circuit 1 is, moreover, driven by an initialization/comparison signal denoted I/C, the signal I/C having the object essentially of controlling the timebase-initialization circuit according to a phase of so-called initialization of the programmable electronic pulse generator, followed by a comparison phase, that is to say a phase during which the programmed waveforms are produced by the previously mentioned outputs $S_j$, as will be described later in the description.

In view of the aforesaid mode of operation, it is understood that the initialization/comparison signal I/C can consist of a simple binary logic signal, for which the initialization phase is enabled for the true value of this binary signal, the comparison phase then being disabled, while conversely, this comparison phase is enabled for the complemented value of the true value of this binary signal, and vice versa.

By convention, it is indicated that the initialization/comparison signal I/C thus corresponds to an initialization signal exhibiting a true value and a so-called comparison signal also exhibiting a true value. The two signals, initialization signal and comparison signal, then exhibit a true value for the complemented values of the aforesaid logic signal.

In accordance with a particular aspect of the pulse generator, which is the subject of the present invention, it is indicated that the timebase-initialization circuit 1 delivers at least m initialization values coded on n bits, for the true value of the initialization signal, each bit of these initialization values being denoted $CAM_{ij}$, with i $\epsilon[0,n-1]$. Furthermore, depending on the type of marking used, corresponding initialization values are stored at the level of the corresponding RAM cells. Thus, for strict comparison, a zero value is stored in the RAM cell with address i, j, whereas for effective marking of the bit with corresponding address i, j, a value 1 is stored in this same RAM cell during this initialization. The timebase-initialization circuit 1 delivers respectively a periodic count value, coded on n bits for the true value of the comparison signal, each bit of the count value being denoted $BL_i$.

For this purpose, as represented also in FIG. 2a, the driven timebase-initialization circuit 1 includes, in a preferred embodiment, an up/down-counter 10 receiving the clock signal CLK, this clock signal delivering the periodic count value coded on n bits from 0 to n−1. The up/down-counter 10 plays, as it were, the role of a timebase insofar as this up/down-counter receiving the clock signal, delivers the aforesaid count value modulo n with systematic resetting to zero once the modulo value is reached. The working of the up/down-counter 10 is entirely conventional and it is not necessary to describe this working in greater detail.

Furthermore, the timebase-initialization circuit 1 includes a multiplexer circuit 11 receiving m initialization values coded on n bits, each bit being denoted $CAM_{ij}$. These initialization values also include the bit values stored at the level of the corresponding RAM cells, and are specific programmed values, as will be described later in the description. The multiplexer circuit 11 also receives the succession of count values coded on n bits delivered by the up/down-counter 10, and it delivers the corresponding bit values as a function of the state of the initialization/comparison signal I/C, as will be described hereafter in the description.

Finally, the driven timebase-initialization circuit 1 includes a plurality of n inverter-amplifier circuits 12. Each inverter-amplifier, denoted $12_0$ to $12_{n-1}$, produces a bit value $BL_0$, $BL_i$ to $BL_{n-1}$, when the initialization/comparison signal I/C corresponds to the true value of the comparison signal or the bits of corresponding rank, denoted by analogy $BL_i$, i $\epsilon[0,n-1]$, m initialization values when the initialization/comparison signal I/C corresponds conversely to the true value of the initialization signal. Each inverter-amplifier $12_i$ delivers this bit value $BL_i$ as well as the complemented value of this bit value, denoted $BLB_i$.

Thus, the timebase-initialization circuit 1 delivers at least the m initialization values coded on n bits for the true value of the initialization signal, respectively a periodic count value also coded on n bits for the true value of the comparison signal, each bit of the count value being denoted $BL_i$, as well, of course, as the complemented values $BLB_i$ of these bit values.

Thus, as represented moreover in FIG. 2a, the electronic pulse generator, which is the subject of the present invention, comprises a decoding module 2, address decoder module, receiving a plurality of address values X $\epsilon[0,m-1]$, this decoding module 2 delivering on word lines a write-control address bit denoted $WL_{1j}$, $WL_{2j}$. The address decoder module can be embodied by way of non-limiting example as a lookup table receiving as input the address values X and delivering a write-control address bit on the aforesaid word lines.

Finally, the pulse generator, which is the subject of the present invention, comprises a bits comparison matrix, bearing the reference 3, this matrix including n×m comparison cells arranged in m rows and n columns, as represented in FIG. 2a. Each comparison cell is denoted $C_{ij}$ and includes a RAM memory cell and a content-addressable memory cell, termed a CAM memory cell.

The RAM memory cells and CAM memory cells are write-addressable on the word lines by a write-control address bit, $WL_{1j}$, and $WL_{2j}$ respectively, mentioned previously in the description. Each comparison cell $C_{ij}$ receives for storage the bit of rank i $BL_i$ of the count value and each comparison cell with address ij makes it possible, on the one hand, to store the corresponding bit $CAM_{ij}$ of the initialization value for the true value of the initialization signal, and, on the other hand, to deliver a value corresponding to the complemented value of the exclusive-OR product of this bit $CAM_{ij}$ of the initialization value and of the bit $BL_i$ of the count value, this value being denoted $\overline{CAM_{ij} \oplus BL_i}$.

Furthermore, each RAM memory cell with address i, j delivers a masking bit value, denoted $M_{ij}$, this masking value being stored for the true value of the initialization signal. Each CAM memory cell and RAM memory cell of like address i, j, hence making up the corresponding comparison cell $C_{ij}$, are coupled by a logic function of OR type to form the corresponding comparison cell $C_{ij}$. Each comparison cell $C_{ij}$ thus delivers a resulting value, denoted:

$$HIT_{ij} = \overline{(CAM_{ij} \oplus BL_i)} + M_{ij}. \quad (1)$$

Finally, as will be observed in FIG. 2a, all the comparison cells $C_{ij}$ of the same line of rank j are coupled by a logic function of OR type to the corresponding output $S_j$. The duration and frequency programmable electronic pulse generator, which is the subject of the present invention, thus makes it possible, by virtue of the architecture represented in FIG. 2a, to perform a comparison between a word of n bits, initialization value stored in the CAM memory cells of each line of rank j for the true value of the initialization signal, and the count value delivered by the driven timebase-initialization circuit 1 for the true value of the comparison signal, and thus to produce on each output $S_j$ a programmed pulse satisfying the relation:

$$HIT_j = \sum_{i=0}^{n-1} HIT_{ij} = \sum_{i=0}^{n-1} [\overline{(CAM_{ij} \oplus BL_i)} + M_{ij}] \quad (2)$$

according to a periodic signal whose period is a harmonic period of the period of the periodic count value of the up/down-counter 10.

Generally, it is indicated that the mode of operation of the duration and frequency programmable electronic pulse generator, which is the subject of the present invention, can be schematized according to the following steps:

a step of loading the initial values to be compared, that is to say the m initial values into the CAM memory cells with address i, j, and a step of loading the masking values $M_{ij}$ into corresponding RAM memory cells with address i, j, these values in fact making it possible to force the comparison to the true value irrespective of the result of the comparison between the value loaded into a CAM memory cell with address i, j and the value of the corresponding bit of rank i, $BL_i$, prevailing at an instant given by the clock period and delivered by the up/down-counter 10 as count value at this instant.

It is indicated that there is no specific order of loading to be complied with, the loading of the CAM memory cells with address i, j and that of the corresponding RAM memory cells with address i, j being able to be performed one after the other, in either order.

The mode of operation of the programmable electronic pulse generator, which is the subject of the present invention, such as represented in FIG. 2a, is illustrated with reference to FIG. 2b, as mentioned previously, for the initialization step or phase during aperiodic working, respectively for the counting or comparison step or phase during periodic working.

A more detailed description of each RAM memory and CAM memory cell making up a comparison cell $C_{ij}$ will now be given in conjunction with FIG. 2c.

As represented in the aforesaid figure, it is indicated that each RAM memory cell comprises at least one first and second MOS type transistor, denoted $T_1$ and $T_2$, whose gate electrode is connected in parallel with the word line $WL_{1j}$. The source electrode of the first transistor $T_1$ and the drain electrode of the second transistor $T_2$ receives the bit value $BL_i$ of the count value, respectively the complemented bit value $BLB_i$ of this count value. The drain electrode of the transistor $T_1$ and the source electrode of the transistor $T_2$ are linked by way of two inverters connected head-to-tail, the common point between the two aforesaid inverters and the source electrode of the second MOS transistor $T_2$ delivering the stored value or masking value $M_{ij}$.

Figure 2C:
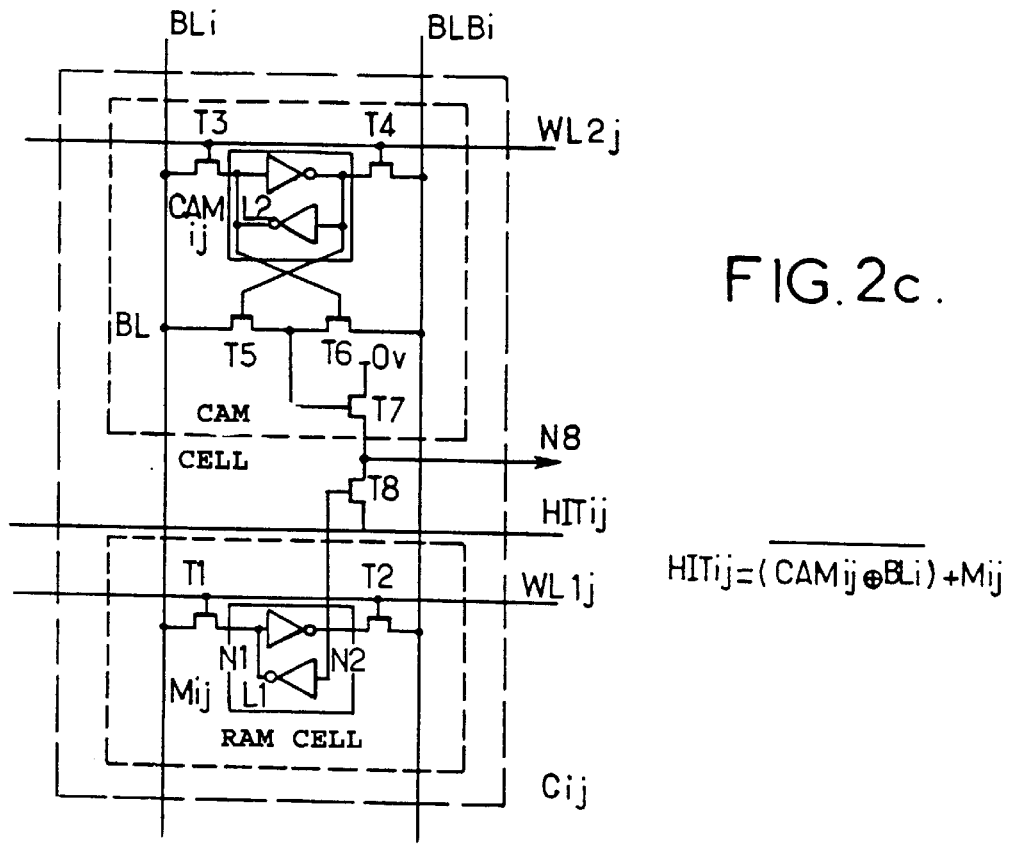

Similarly as represented in FIG. 2c, each CAM memory cell comprises at least one first and one second MOS transistor, denoted $T_3$, $T_4$, whose gate electrode is connected in parallel with the word line $WL_{2j}$ and whose source electrode, respectively drain electrode, receives the bit value $BL_i$, respectively the complemented bit value $BLB_i$, of the count value delivered by the up/down-counter 10. The drain electrode, respectively source electrode, of the first and second transistors $T_3$, $T_4$ is linked by way of two inverters connected head-to-tail in a similar manner to the structure of the RAM memory previously described in conjunction with FIG. 2c.

Furthermore, a third, $T_5$, and a fourth MOS transistor, $T_6$, are connected in cascade by way of a common point between their drain electrode and source electrode. The source electrode of the third MOS transistor $T_5$ receives the bit value $BL_i$ and the drain electrode of the fourth MOS transistor $T_6$ receives the complemented bit value $BLB_i$ of the count value delivered by the up/down-counter 10. The gate electrodes of the third, $T_5$, and of the fourth, $T_6$, MOS transistor are connected to the source electrode of the second, $T_4$, respectively to the drain electrode of the first MOS transistor $T_3$.

Finally, a fifth MOS transistor, $T_7$, is provided, the source electrode of this fifth transistor being connected to the reference voltage, 0 volt earth voltage of the device for example, whereas the gate electrode of the fifth transistor $T_7$ is connected to the common point of the third and of the fourth MOS transistor $T_5$, $T_6$. The drain electrode of the fifth MOS transistor $T_7$ delivers the complemented value of the exclusive-OR product between the values stored by the CAM memory cell, stored values $CAM_{ij}$ and $BL_i$.

Finally, as represented in FIG. 2c, the OR type coupling between CAM and RAM memory cells of like address i, j is carried out by way of a MOS transistor $T_8$, coupling transistor whose source electrode is linked to the drain electrode of the fifth MOS transistor $T_7$ and receives the complemented value of the exclusive-OR product between the stored values $CAM_{ij}$ and $BL_i$. The gate electrode of the coupling transistor $T_8$ is connected to the common point between the second MOS transistor $T_2$ and the head-to-tail inverters of the RAM memory cell of like address i, j. The drain electrode of the coupling transistor $T_8$ delivers the resulting value according to the relation (1) mentioned previously in the description.

Finally, it is indicated that the coupling by a logic function of OR type of all the comparison cells $C_{ij}$ of the same line of rank j is performed, for example, by the interconnecting in parallel of all the drain electrodes of the MOS coupling transistors $T_8$ to an output line connected to the output $S_j$ of corresponding rank j.

The working of each RAM and CAM cell with address i, j is as follows:

When the word line $WL_{1j}$ is taken to the high level, for write control, the MOS transistors $T_1$ and $T_2$, of N type for example, are rendered conducting. If, by way of example, at the same instant, it is assumed that a signal of high level is applied to the bit line $BL_i$ and that consequently a low level is applied to the bit line of the complemented value bit $BLB_i$, the potential of the bit line at the value $BL_i$ is applied to the node $N_1$ of the head-to-tail inverters $L_1$ of the RAM cell, these head-to-tail inverters in fact constituting a latching circuit or latch, by way of the transistor $T_1$, whereas the potential corresponding to the complemented value $BLB_i$ is applied to the node $N_2$ of the latching circuit $L_1$ by way of the transistor $T_2$. Under these conditions, it is considered that the latching circuit $L_1$ has stored a value at the level 1. This value corresponds to the masking value $M_{ij}$ of the corresponding address i, j.

Under the same conditions, when the word line $WL_{1j}$ is taken to the high level while the bit line for the value $BL_i$ is at the low level, the complemented value $BLB_i$ being by contrast taken to the high level, it is considered that the latching circuit $L_1$ has conversely stored a low level, so-called 0 level.

Accordingly, when the latching circuit $L_1$ is deemed to have stored a value 1, it is understood that the node $N_1$ is at the high potential and that the node $N_2$ is at the low potential, and vice versa, the latching circuit $L_1$ is deemed to have stored a value 0, or low value, when the node $N_1$ is at the low potential and the node $N_2$ at the high potential.

As far as the working of each CAM memory cell is concerned, this can be illustrated in the manner below.

Each CAM cell in fact comprises the same structure as the RAM cell of like address, with the exception of the transistors $T_5$, $T_6$ and $T_7$. The working of each CAM memory cell in storage mode is therefore identical to that of each RAM memory cell when the write-command word line $WL_{2j}$ is taken to the high potential, the bit value $BL_i$ of the count value being taken to the high or low potential and the corresponding complemented value $BLB_i$ to the corresponding complemented value.

Assuming, by way of illustration, that the latching circuit $L_2$ of the CAM memory cell has previously stored a value 1, when a low level $BL_i$ and consequently a high level $BLB_i$ are applied, the transistor $T_5$ of NMOS type remains blocked, whereas the transistor $T_6$ of like type becomes conducting, thus applying a potential of high level to the gate of the transistor $T_7$ of NMOS type, the node $N_8$ represented in FIG. 2c being thus taken to a low potential.

Likewise if, by way of example, it is assumed that the latching circuit $L_2$ of the CAM memory cell has previously stored a value 0, low potential, and that a bit value corresponding to a high potential $BL_i$ and therefore a complemented bit value $BLB_i$ corresponding to a low potential are applied, the gate of the transistor $T_5$ of NMOS type is taken to a high level, rendering this transistor conducting, and the node $N_8$ of FIG. 2c is taken to a low potential by way of the transistor $T_7$ which is conducting.

The other cases correspond in succession to:

latching circuit $L_2$ of the CAM memory cell at the value 1, $BL_i$ at the high level, $BLB_i$ at the low level;

latching circuit of the CAM memory cell at the value 0, $BL_i$ at the low level, $BLB_i$ at the high level.

Node $N_8$ remains at a high level if, for example, it was placed at such a level by a preload element represented in FIG. 2a for each corresponding CAM memory cell.

Thus, when the word to be compared, that is to say the instantaneous count value delivered by the up/down-counter 10 differs by one or more bits from the word stored on the same line of rank j of CAM memory cell, the above relation is at the true value when the corresponding masking values are at the active value.

An example of a true value of the comparisons delivered by each comparison cell $C_{ij}$ is given in Table 2 below:

TABLE 2

| | | | | | | | | | | | | | | | | |
|---|---|---|---|---|---|---|---|---|---|---|---|---|---|---|---|---|
| $CAM_{ij}$ | 1 | 0 | 0 | 1 | 0 | 0 | 1 | 1 | 0 | 0 | 0 | 1 | 0 | 1 | 1 | 1 |
| $BL_i$ | 1 | 0 | 0 | 0 | 1 | 0 | 1 | 1 | 1 | 0 | 0 | 1 | 1 | 0 | 1 | 1 |
| $M_{ij}$ | 0 | 0 | 1 | 1 | 1 | 0 | 0 | 1 | 1 | 0 | 0 | 0 | 1 | 1 | 0 | 0 |

The working of the assembly is represented by Table 1 below, the value $BLB_i$ still denoting the complemented value of $BL_i$.

TABLE 1

| $CAM_{ij}$ | $BL_i$ | N8 |
|---|---|---|
| 0 | 0 | 1 |
| 0 | 1 | 0 |
| 1 | 0 | 0 |
| 1 | 1 | 1 |

This mode of operation makes it possible to realize an exclusive-NOR identity function at the node $N_8$ of each comparison cell $C_{ij}$ satisfying the logic relation:

$$N_8 = \overline{CAM_{ij} \oplus BL_i}. \quad (3)$$

The control of the gate of each transistor $T_8$ by the corresponding RAM cell then makes it possible to obtain the logic relation (2) mentioned previously in the description.

Figure 2D:
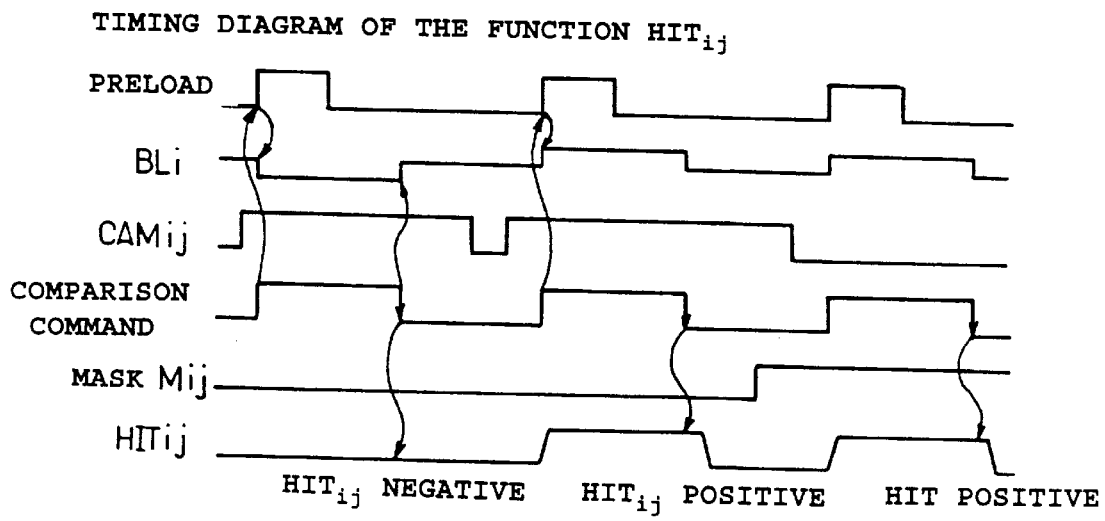
FIG. 2d represents a timing diagram of the signals employed at the level of a comparison cell $C_{ij}$, consisting of a RAM memory cell and a content-addressable memory cell, CAM memory cell.

The timing diagram of the value resulting from a preload signal delivered to each RAM and CAM memory cell by a preload circuit of conventional type, such as represented in FIG. 2a, is given in FIG. 2d for the comparison cell $C_{ij}$. The preload circuits are not described by reason of their conventional type known to a person skilled in the art.

Multiplication on a line for n bits making up the count values, for example for n=16, makes it possible to perform a comparison between a 16-bit word stored in the CAM memory cells of the relevant line and a word of a corresponding number, n=16 for example, of bits corresponding to the count value, that is to say to the values $BL_i$ and $BLB_i$ previously mentioned in the description, the quiescent state being manifested as $BL_i=BLB_i$, all the comparison results delivered by the comparison cells of the same line being related by the OR logic link previously mentioned in the description.

Under these conditions, the corresponding output $S_j$, for the relevant line of rank j, satisfies the relation (3) mentioned previously in the description.

In this relation, when all the masking bits $M_{ij}$ are stored inactive, the above relation is at the true value if and only if all the comparisons are identical, which implies that $CAM_{ij}=BL_i$.

If, conversely, all the masking bits $M_{ij}$ are stored active, the above relation is at the true value irrespective of the content of the word corresponding to the count value, that is to say to the corresponding values of the bits $BL_i$ and complemented value $BLB_i$.

Of course, a plurality of comparison words, that is to say the m initial values, can thus be provided for, each word being stored at the level of a line of memory cells of CAM type, the duration and frequency programmable electronic pulse generator, which is the subject of the present invention, then exhibiting the matrix configuration of comparison cells, such as represented in FIG. 2a.

It is thus understood that the electronic pulse generator, which is the subject of the present invention, makes it possible to program each line of rank j of comparison cells $C_{ij}$ in such a way as to vary the number and width of the pulses in a period given by the recurrence period of the up/down-counter 10, according to the mode of operation which will be explained hereafter in the description.

With the help of the structure represented in FIG. 2a, it is thus possible to embody a duration and frequency programmable electronic pulse generator with m outputs, it being possible in fact to regard each output $S_j$ as a distinct generator $PWM_j$.

With each edge of the clock signal CLK delivered by the system clock for example, the up/down-counter 10 of the driven timebase-initialization circuit 1 is incremented and a comparison is thus made between the output from the up/down-counter, that is to say the instantaneous count value and the content of the matrix of slots, that is to say each line of CAM memory cells and RAM memory cells.

The period of the pulses delivered is the modulo of the counter, that is to say a harmonic period of the period of the periodic count value. It is, of course, understood that depending on the programmed values, especially the masking bits $M_{ij}$ and the initialization values, the period of the pulses can be either equal to the count period of the up/down-counter or, conversely, a harmonic period of the latter, as will be described hereafter.

The various variable-duration and multipulse waveforms will be described in conjunction with FIG. 2e in a non-limiting example implementation using an up/down-counter of value $2^5$ for a preloaded value, that is to say an initialization value corresponding to a line of rank j for example, this preloaded value being arbitrarily taken equal to the value 10010.

Represented in FIG. 2e are, on the one hand, the states of the up/down-counter 10, that is to say the count value and ultimately the value of the bits of order $2^0$ to $2^4$, as well as the corresponding values contained in a line of rank j of corresponding CAM memory cells.

In conjunction with FIG. 2e, it is indicated that for the initialization value 10010 loaded into CAM memory, when the count value of the up/down-counter reaches this value, that is to say upon comparison or strict identity represented in FIG. 2e between the count value and the initialization value, a single pulse is obtained per count period of the up/down-counter, the duration of which is equal to a clock cycle CLK.

If, conversely, the low-order bit, bit of order $2^0$, is masked, the value $M_{0j}$ being taken to the value X, the value X here denoting either the value 0 or 1, the previous relation (2) is true twice running, this making it possible to produce a pulse whose duration is equal to two clock cycles, as represented in the waveform 1 of FIG. 2e.

If, furthermore, the bit of order $2^1$ is masked, the initialization value being taken to the value 100XX, the relation (2) becomes true four times running, as represented in slot 2 of FIG. 2e, and so on. It is thus possible to vary the duration of a pulse to the power of twice the duration of the period or of the system clock cycle in the interval of a count period of the up/down-counter, by consecutively masking the low-order bits towards the high-order bits. The duration D of the pulse produced thus satisfies the relation:

$$D = 2^{k+1} \qquad (4)$$

where k represents the order of the bit of highest rank of the masked bits.

The corresponding waveforms are given at positions 1 and 2 of FIG. 2e.

As far as the multipulse programming is concerned, the latter may be achieved by unmasking the lowest-order bit, bit of order $2^0$, for the obtaining of a strict comparison between the corresponding value stored in CAM memory and the value $BL_j$, and furthermore, by masking one bit from among the n−1 remaining bits. Two pulses are then produced whose duration is equal to a duration of the system clock cycle CLK.

The distance, expressed as a number of clock periods CLK between these two pulses, depends on the order of the masked bit.

Thus, the number of pulses obtained is a power of 2 of the number of masked bits, whereas the distance between the pulses is given by the relation:

$$d = 2^p \qquad (5)$$

where p represents the order of the masked bit.

The waveforms represented at the slots 3, 4, 5 and 6 of FIG. 2e make it possible to verify the result previously indicated.

The duration and frequency programmable electronic pulse generator, which is the subject of the present invention, makes it possible, of course, to program all waveforms with a recurrence, that is to say a distance between pulses which depends on the rank of the masked bit and a number of pulses which depends on the number of masked bits.

Thus, if we consider a sequence $2^r$, $2^s$ and $2^t$ where r, s and t represent the rank of the masked bits, a periodic pattern such as represented in positions 7 and 8 of FIG. 2e can be obtained with the following parameters:

distance $d_1 = 2^r$, where r represents the rank of the bit of highest order of the masked bits;

distance $d_2 = 2^s$, where s represents the rank of the bit of lowest order of the masked bits;

$d_1$ represents the distance between patterns made up of two elementary pulses, whereas $d_2$ represents the distance between elementary pulses making up a pattern;

the number of patterns made up of elementary pulses is given by $N = 2^t$ where t represents the number of masked bits.

Within the framework of FIG. 2e, it is indicated that the waveforms represented at positions 1 and 2 are in fact merely a particular case in which the distance $d_1$ is equal to 1, i.e., for r=0, whereas the distance $d_2$ is equal to the number, i.e. $2^s = 2^t$.

As far as the waveforms represented at positions 3, 4, 5 and 6 are concerned, these constitute a particular case for which r=s.

The embodiment of the duration and frequency programmable electronic pulse generator circuit, which is the subject of the present invention, previously described in conjunction in particular with FIGS. 2a et seq., appears particularly interesting insofar as it makes it possible to produce pulse trains made up of multipulse patterns, this making it possible considerably to increase the flexibility of use of this type of generator as compared with the systems described in the prior art.

However, it will be noted that in the aforesaid embodiment, the distances and the number of pulses are integer powers of 2. Such a limitation precludes adjustment as fine as the system clock period or cycle, which, in certain cases, may constitute a drawback.

In order to remedy the aforesaid drawback, a preferred embodiment of the duration and frequency programmable electronic pulse generator, which is the subject of the present invention, will be described in conjunction with FIGS. 3a and 3b.

Figure 3A:
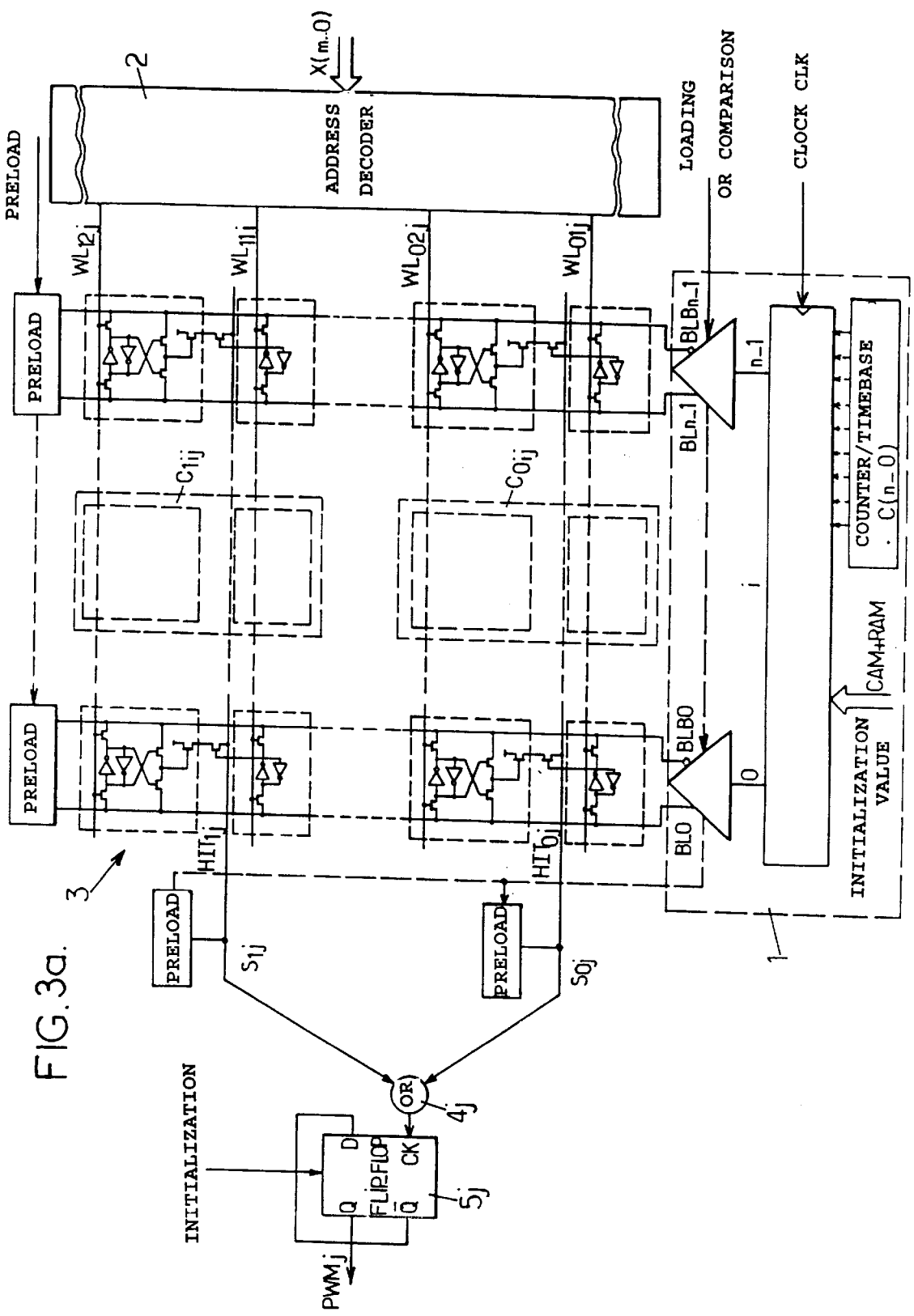
FIG. 3a represents a variant embodiment of the duration and frequency programmable electronic pulse generator represented in FIG. 2a, in which at least one of the lines of comparison cells has been split into a first and a second elementary line of comparison cells, so as to allow the superposition of distinct electronic pulse trains produced by each elementary line of comparison cells.

According to the aforesaid embodiment represented in FIG. 3a, each line of comparison cells of rank j is split into a first and a second elementary line of comparison cells, each comparison cell bearing the reference $C_{0ij}$, respectively $C_{1ij}$, the first index 0 or 1 denoting the splitting index of each comparison cell to form the first and the second elementary line of comparison cells. It is understood, as represented in FIG. 3a, that the comparison cells are aligned to form the first and the second elementary line, each elementary line being interconnected to a corresponding output $S_{0j}$, respectively $S_{1j}$, the first index denoting the splitting index.

According to a particularly advantageous aspect of the programmable electronic pulse generator, which is the subject of the present invention, as represented in the embodiment of FIG. 3a, each elementary line of comparison cells, that is to say the lines denoted $S_{0j}$ and $S_{1j}$, are programmable independently and complementarily the one from the other, so as to deliver patterns of complementary pulse trains.

By elementary lines of comparison cells which are programmable independently and complementarily the one from the other, it is understood that each elementary cell line can be programmed independently, that is to say regardless of the programming of the other elementary line of comparison cells. The complementary nature of the programming resides in the fact that the identical programming of the one and the other of the elementary lines of cells offers no actual interest and that, in accordance with the subject of the present invention, it is advantageous to program the one and the other of the elementary lines of comparison cells $S_{0j}$ and $S_{1j}$ in such a way that the patterns produced are distinct, so as to allow the superposition of these patterns to create a specific, much finer pattern or pulse train, as will be described hereafter in the description.

Thus, as will be observed in FIG. 3a, it is indicated that the generator furthermore includes, for each first and second elementary line pair $S_{0j}$ and $S_{1j}$ as represented in FIG. 3a, an OR type logic circuit interconnected to the first and second elementary outputs $S_{0j}$ and $S_{1j}$, this OR type logic circuit delivering a superposition signal for the complementary patterns or train of pulses programmed on each elementary comparison cell line.

The OR type logic circuit, bearing the reference $4_j$ in FIG. 3a, thus makes it possible to ensure the superposition of the complementary pulse train patterns programmed on the elementary lines $S_{0j}$ and $S_{1j}$.

However, as represented also in FIG. 3a, the OR type logic circuit $4_j$ can be followed by a circuit referenced $5_j$, of bistable type for example, receiving the superposition signal and delivering a resulting signal whose temporal resolution is equal to that of the period of the reference clock signal.

The embodiment described in FIG. 3a in fact makes it possible to adjust the pulse trains or pulses to the desired duration with a precision corresponding to the duration of the period or cycle of the system clock CLK.

Figure 3B:
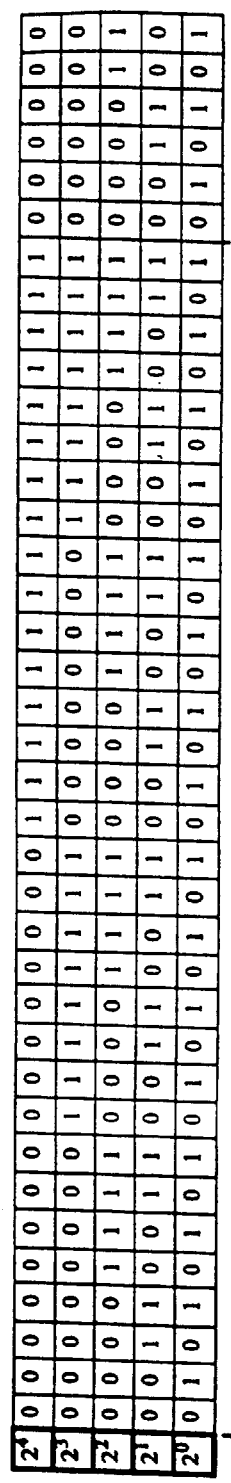
FIG. 3b gives, by way of non-limiting example, a timing diagram of the distinct electronic pulse trains produced by each elementary block of comparison cells, and of their combining following their superposition, to obtain a resulting electronic pulse train.
Figure 3B:
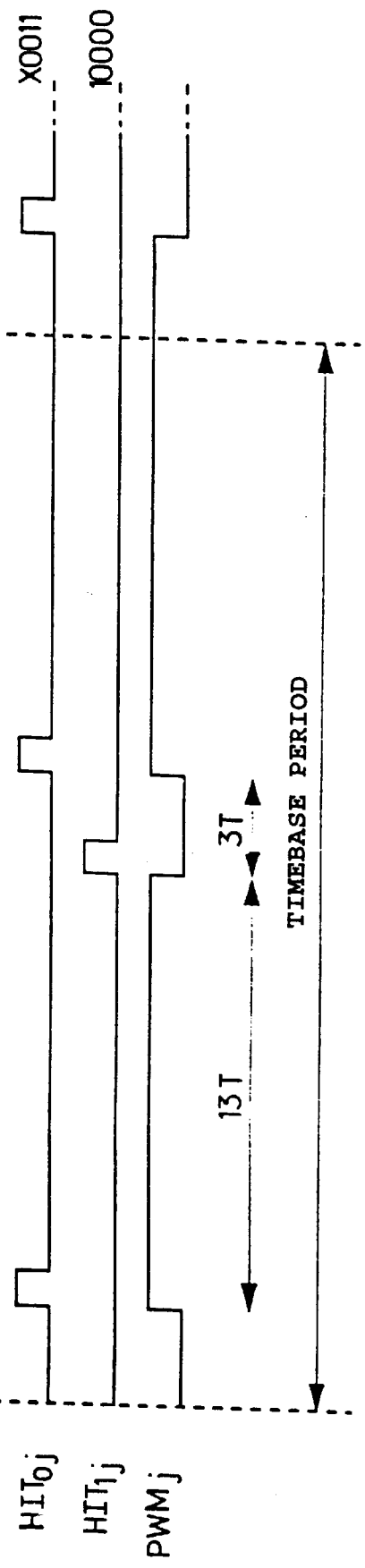

Represented by way of non-limiting example in FIG. 3b are the timing diagrams of pulses obtained when implementing a duration and frequency programmable electronic pulse generator in which a line of rank j of comparison cells is made up of two elementary lines, a first elementary line being programmed so as to deliver a signal represented by $HIT_{0j}$ for an initial value containing 5 bits, the highest-order bit being masked at the value X, the following two bits being at the value 0, and the last two bits at the value 1, whereas the second elementary line is programmed so as to deliver a signal $HIT_{1j}$ for an initial value coded on 5 bits, of which the highest-order bit is equal to the value 1 and the other four successive bits equal to the value 0.

It is understood that in this case, the signals $HIT_{0j}$ and $HIT_{1j}$ are applied to the input of the OR gate referenced $4_j$, thus making it possible to drive the flip-flop circuit $5_j$ in such a way as to deliver the resulting signal $PWM_j$ as represented in FIG. 3b, consisting of a series of pulses of duration 3 T where T represents the system clock cycle CLK, these pulses being separated by 13 periods or clock cycles T.

It is, of course, indicated that the principle of multipulses can be applied in such a way as to obtain, via a flip-flop or, as the case may be, in the absence of the flip-flop $5_j$, waveforms of desired recurrence.

A particularly powerful duration and frequency programmable electronic pulse generator has thus been described, powerful insofar as, by virtue of a particularly flexible implementation of each line of comparison cells, it is possible to obtain, on each of them, a plurality of pulses configured as pulse trains or patterns whose temporal resolution is at most equal to that of the period or cycle of the system clock signal CLK.

This type of electronic pulse generator appears particularly satisfactory insofar as it is possible to envisage widely varying applications such as generators of periodic signals of various periods of physiological phenomena, such as cardiac pulsations or the like, or, for example, duration and frequency programmable electronic pulse generators in the form of dedicated circuits intended for frequency signature recognition for transmission sources.

We claim:

1. A duration and frequency programmable electronic pulse generator comprising m distinct programmable outputs, $S_j$, j $\in$[0, m−1], said generator comprising:

a timebase-initialization circuit driven by a reference clock signal and by an initialization/comparison signal comprising an initialization signal and a comparison signal, said timebase-initialization circuit producing, respectively, at least m initialization values coded on n bits for the true value of said initialization signal, each bit of each of said initialization values being denoted $CAM_{ij}$, i $\in$[0, m−1] a periodic count value coded on n bits for the true value of said comparison signal, each bit of said count value being denoted $BL_i$;

decoding means for receiving a plurality of address values X $\in$[0, m−1] and for producing on word lines a write-control address bit $WL_{1j}$, $WL_{2j}$;

a bits comparison matrix including n×m comparison cells arranged in m rows and n columns, each comparison cell $C_{ij}$ including a RAM memory cell and a CAM memory cell comprised of a content-addressable memory cell, each said memory cell being write-addressable on said word lines by respective write-control address bits $WL_{1j}$ and $WL_{2j}$ and each said cell receiving for storage the bit of rank i $BL_i$ of said count value, each comparison cell with address i, j storing said corresponding bit $CAM_{ij}$ of said initialization value for the true value of said initialization signal and producing, for the true value of said comparison signal, a value $\overline{CAM_{ij} \oplus BL_i}$, which is the complemented value of the exclusive-OR product of said bit $CAM_{ij}$ of said initialization value and the bit $BL_i$ of said count value, each RAM memory cell with address i, j producing a masking bit value stored for the true value of said initialization signal, and denoted $M_{ij}$, and each CAM and RAM memory cell of like address i, j being coupled by an OR logic coupling to form said comparison cell $C_{ij}$ and each comparison cell producing a resulting value $$HIT_{ij} = \overline{(CAM_{ij} \oplus BL_i)} + M_{ij},$$

all of the comparison cells $C_{ij}$ of the same line of rank j being coupled by an OR logic function to the corresponding output $S_j$ the same rank j, so as to enable a comparison between a word of n bits initialization value stored in the CAM memory cells of each line of rank j for the true value of said initialization signal and said count value produced by the timebase-initialization circuit for the true value of the comparison signal and thereby producing, on each output $S_j$, a programmed pulse satisfying the relation:

$$HIT_j = \sum_{i=0}^{n-1} HIT_{ij} = \sum_{i=0}^{n-1} [\overline{(CAM_{ij} \oplus BL_i)} + M_{ij}]$$

according to a periodic signal having a period which is a harmonic period of the period of said periodic count value.

2. The generator according to claim 1, wherein said timebase-initialization circuit includes:

an up/down-counter receiving said clock signal and producing said periodic count value coded on n bits;

a multiplexer circuit receiving said m initialization values coded on n bits $CAM_{ij}$, and receiving said periodic count value coded on n bits produced by said up/down-counter, each bit value of said periodic count value being denoted $BL_i$, and said multiplexer circuit producing corresponding bit values $BI_i$; and a plurality of n inverter amplifier circuits each receiving a bit value $BL_i$ and producing said bit value $BL_i$ and the complemented value of said bit value, $BLB_i$.

3. The generator according to claim 1, wherein RAM each memory cell comprises at least first and second MOS transistors ($T_1$, $T_2$) each having a gate electrode connected in parallel with said word line $WL_{ij}$ and a source electrode and a drain electrode for receiving, respectively, said bit value $BL_i$, and said complemented bit value $BLB_i$, and said drain electrode and said source electrode being coupled by two inverters connected head-to-tail, and a common point between the two inverters and the source electrode of said second MOS transistor producing said stored masking bit value $M_{ij}$.

4. The generator according to claim 1, wherein said CAM memory cell comprises:

first and second MOS transistors ($T_3$, $T_4$) each having a gate electrode connected in parallel with said word line $WL_{2j}$ and a source electrode and a drain electrode for receiving, respectively, said bit value $BL_i$ and said complemented bit value $BLB_i$, and said drain electrode and source electrode being coupled by two inverters connected head-to-tail;

third and fourth MOS transistors ($T_5$, $T_6$) each having a drain electrode and a source electrode, said third and fourth MOS transistors being connected in cascade through a common point between the drain of said third MOS transistor and the source electrode of said fourth MOS transistor, the source electrode of said third MOS transistor ($T_5$) receiving said bit value $BL_i$ and the drain electrode of said fourth MOS transistor ($T_6$) receiving said complemented bit value $BLB_i$, the gate electrodes of said third and fourth MOS transistors ($T_5$, $T_6$) being connected to said source electrode of said second MOS transistor ($T_4$), and said drain electrode of said first MOS transistor ($T_3$), respectively; and a fifth MOS transistor ($T_7$) having a source electrode connected to a reference voltage and a gate electrode connected to said common point of said third and fourth MOS transistors ($T_5$, $T_6$), the drain electrode of said fifth MOS transistor ($T_7$) producing said complemented value of the exclusive-OR product between said stored initialization value $CAM_{ij}$ and said stored bit value $BL_i$.

5. The generator according to claim 3, wherein said OR logic coupling between CAM and RAM memory cells of like address i, j comprises a further MOS coupling transistor ($T_8$) having a source electrode connected to the drain electrode of said fifth MOS transistor ($T_7$) so as to receive said complemented value of the exclusive-OR product between the stored initialization value $CAM_{ij}$ and said shared bit value $BL_i$, a gate electrode connected to the common point between said second MOS transistor ($T_2$) and said head-to-tail inverters of the RAM memory cell of like address i, j, and a drain electrode producing said resulting value $$HIT_{ij} = \overline{(CAM_{ij} \oplus BL_i)} + M_{ij}.$$

6. The generator according to claim 5, wherein said OR logic coupling of all the comparison cells $C_{ij}$ of the same line of rank j comprises means for interconnecting in parallel of all the drain electrodes of said further MOS coupling transistors ($T_8$) to an output line connected to the output $S_j$ of corresponding rank j.

7. The generator according to claim 1, wherein each line of comparison cells of rank j is split into first and second elementary lines of comparison cells, each elementary line of comparison cells being programmable independently and complementarily, one from the other, so as to produce patterns of complementary pulse trains, and each elementary line being connected to first and second elementary outputs, said generator further including, for each of first and second elementary lines of comparison cells:

an OR logic circuit connected to said first and second elementary outputs and producing a superposition signal for said pattern of complementary pulse trains; and a bistable circuit receiving said superposition signal and producing a resulting signal having periods equal to the period of said reference clock signal.

* * * * *